United States Patent [19]
Mueller et al.

[11] 3,943,555
[45] Mar. 9, 1976

[54] SOS BIPOLAR TRANSISTOR

[75] Inventors: Charles William Mueller, Princeton; Edward Curtis Douglas, Princeton Junction, both of N.J.

[73] Assignee: RCA Corporation, New York, N.Y.

[22] Filed: May 2, 1974

[21] Appl. No.: 466,287

[52] U.S. Cl. .................. 357/49; 148/1.5; 357/4; 357/35; 357/52; 357/56; 357/71; 357/91
[51] Int. Cl.$^2$.................. H01L 27/12; H01L 29/72; H01L 21/86; H01L 21/265
[58] Field of Search ............. 357/35, 49, 56, 91, 71, 357/4, 52

[56] References Cited
UNITED STATES PATENTS

| | | | |
|---|---|---|---|
| 3,383,567 | 5/1968 | King et al. | 357/91 |
| 3,486,892 | 12/1969 | Rosvold | 357/49 |
| 3,567,508 | 3/1971 | Cox et al. | 357/71 |
| 3,602,781 | 6/1971 | Hart | 357/91 |
| 3,660,732 | 5/1972 | Allison | 357/35 |
| 3,666,548 | 5/1972 | Brack et al. | 357/49 |
| 3,761,319 | 9/1973 | Shannon | 357/91 |
| 3,890,632 | 6/1975 | Ham et al. | 357/49 |

OTHER PUBLICATIONS
Ronen et al., "Recent Advances in Thin-Film Silicon Devices on Sapphire Substrates," Proceedings of the IEEE, Vol. 59, pp. 1506–1510, Oct. 1971.

Fogiel, *Modern Microelectronics* (Research and Education Assn., N.Y., 1972) pp. 429–430.

*Primary Examiner*—William D. Larkins
*Attorney, Agent, or Firm*—H. Christoffersen; T. H. Magee

[57] ABSTRACT

A planar bipolar transistor is made by the successive ion implantations of selected atoms into selected regions of a layer of doped single-crystal silicon on an insulating substrate, such as sapphire or spinel. The silicon layer is epitaxially grown, has a thickness of between 0.5 and 5 $\mu$m, and is formed in two strata of different resistivities. A collector contact well is ion implanted into the upper stratum and annealed to diffuse it into the lower stratum of lower resistivity. The transistor is isolated, as a mesa, on the substrate; and an edge-guard region is ion implanted through the periphery of the mesa, except in the region of the emitter-base junction.

3 Claims, 9 Drawing Figures

SOS BIPOLAR TRANSISTOR

The invention herein described was made in the course of, or under, a contract with the Department of the Air Force.

This invention relates generally to a bipolar transistor and a method of making it. More particularly, the invention relates to a novel planar bipolar transistor in a layer of single-crystal silicon epitaxially deposited on an insulating substrate, and to a novel method of making the transistor, involving ion implantation. The novel transistor and method of making it are particularly useful in the manufacture of electronic apparatus wherein it is desired to utilize a planar bipolar transistor in a relatively thin epitaxial silicon layer on an insulating substrate, such as a layer of epitaxial silicon on a substrate of sapphire (SOS).

It is practically impossible to make a satisfactory bipolar transistor by conventional methods of diffusing impurities into a thin epitaxial layer of silicon on an insulating substrate. In typical layers of epitaxial silicon on sapphire, for example, where the thickness of the silicon layer is between 0.5 and 5 micrometers ($\mu$m), the emitter and collector junctions of a satisfactory bipolar transistor should have a separation of only a few thousand Angstroms. Producing accurate diffusion profiles of impurities without spikes by conventional methods of diffusion is practically an impossible task with silicon on sapphire (SOS) because the quality of the silicon deposited on sapphire or other suitable materials such as spinel is not the same as that of bulk silicon or of an epitaxial layer of silicon on a substrate of bulk silicon.

The silicon which is grown epitaxially on sapphire, for example, is different from the silicon which is deposited on "bulk" silicon wafers in a number of significant ways. The silicon deposited epitaxially on sapphire does not possess anything approaching the crystal perfection that exists in a bulk single-crystal wafer of silicon. The crystal structure of the silicon layer on sapphire does not even compare well with epitaxial silicon layers grown on silicon substrates. In the case of silicon on sapphire (SOS), it has been observed that the portion of the silicon layer nearest the sapphire substrate is not even a good semiconductor, i.e. it is almost insulating. Thus, the SOS layer can be distinguished from "silicon," as the term applies to bulk silicon wafers, by the former's lack of good crystal structure.

Another difference which distinguishes an SOS layer from silicon in bulk is the relatively higher density of defects to be found in former. This manifests itself, in one way, in the very low minority carrier lifetime found in SOS. Lifetimes in the range from about 0.1 nanosecond to 10 nanoseconds at the very best are typical for these SOS layers. In bulk silicon, lifetimes, at the very worst, are nearer 10 nanoseconds and above. Typically, lifetimes in bulk silicon range between about 100 nanoseconds and about 1 microsecond; and they can be as high as 100 microseconds.

The very low lifetime of minority carriers is one of the reasons why SOS has found a large application in the field of MOS (Metal-oxide-silicon) type device structures, and not so much application in the field of bipolar device structures. The MOS device is a majority carrier device, whereas the bipolar device is a minority carrier device and needs relatively higher minority carrier lifetimes in the base region thereof. The relative ease with which bipolar transistors can be built in bulk by prior art methods of diffusion, because of the better lifetimes to be found in bulk silicon, is another means of distinguishing SOS from bulk silicon.

Another manifestation of the high defect nature of SOS is the uncontrolled nature of the impurity diffusion constant. Activation energies in SOS, i.e. the minimum energy (usually supplied by heating) to move an atom out of its position in the crystal, are generally lower and not as uniform and controlled as in bulk silicon. Hence, fast localized diffusion occurs much more easily in SOS. This fast diffusion tends to short out the emitter-base junction of bipolar devices made in SOS. This is especially true for SOS bipolar transistors because the emitter-collector separation distance must be very small and because the lifetime is so poor.

The atoms of silicon grown epitaxially on sapphire wafers may be the same as the atoms of silicon that make up a bulk wafer, but the resulting SOS behaves in drastically different ways from bulk silicon.

The diffusion in SOS material is faster in the vertical direction than in the lateral direction. Consequently, there is more of a tendency for a diffused emitter to diffuse through the base and short to the collector in SOS material than in bulk silicon. When the same fabrication techniques normally used on bulk silicon are applied to SOS devices, none of them is practical because of the occurrence of emitter-to-collector shorts.

Briefly stated, the present novel planar bipolar transistor is an ion implanted structure in a layer of single-crystal semiconductor material epitaxially deposited on an insulating substrate to a thickness of between about 0.5 and about 5 $\mu$m. The novel method of making the bipolar transistor comprises implanting a collector contact well, a base region, and an emitter region into the semiconductor material by ion implantation.

In a preferred embodiment, the single-crystal layer of silicon comprises two strata, a first or lower stratum adjacent to the insulating substrate, having a lower electrical resistivity than the remaining or upper stratum into which substantially all of the ion implantation is directed. The silicon layer is annealed after a collector contact well is ion implanted into the upper stratum so as to diffuse the collector contact well into contact with the lower stratum.

In another embodiment of the present novel transistor, the silicon layer into which the transistor is ion implanted is etched to the insulating substrate, leaving the transistor on an isolated island or mesa. Unwanted capacitance and feedback are eliminated or substantially reduced by this expedient.

In still another embodiment of the present novel transistor, the transistor is isolated as a mesa and an edge-guard region of impurities is ion implanted into a portion of the periphery of the mesa to stabilize the transistor with respect to leakage currents.

In a further embodiment of the present novel transistor, the transistor is fabricated with substantially parallel collector contact wells, base contact wells, and an emitter region so that the transistor can be divided into a plurality of similar transistors, each comprising a mesa on an insulating surface.

The novel planar transistor and method of making it will be explained with the aid of the accompanying drawings in which.

Figure 1:
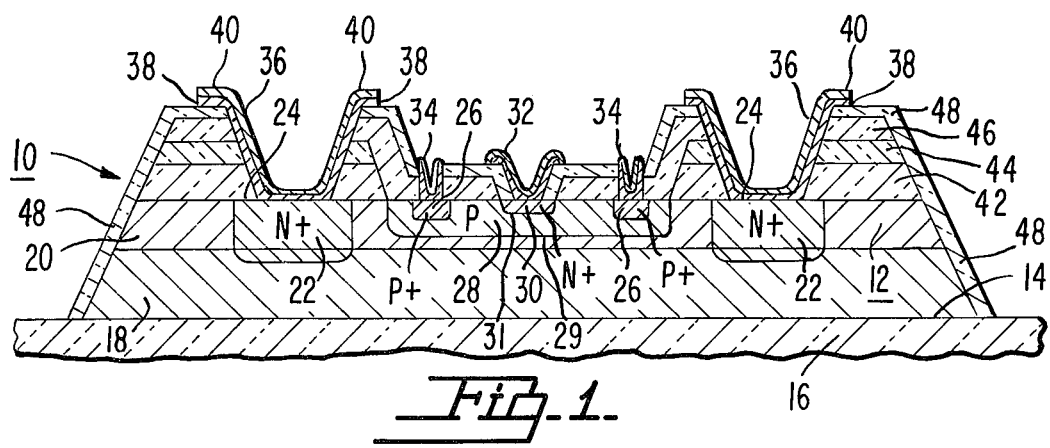
FIG. 1 is a fragmentary cross-sectional view of one embodiment of the novel bipolar transistor.
Figure 1A:
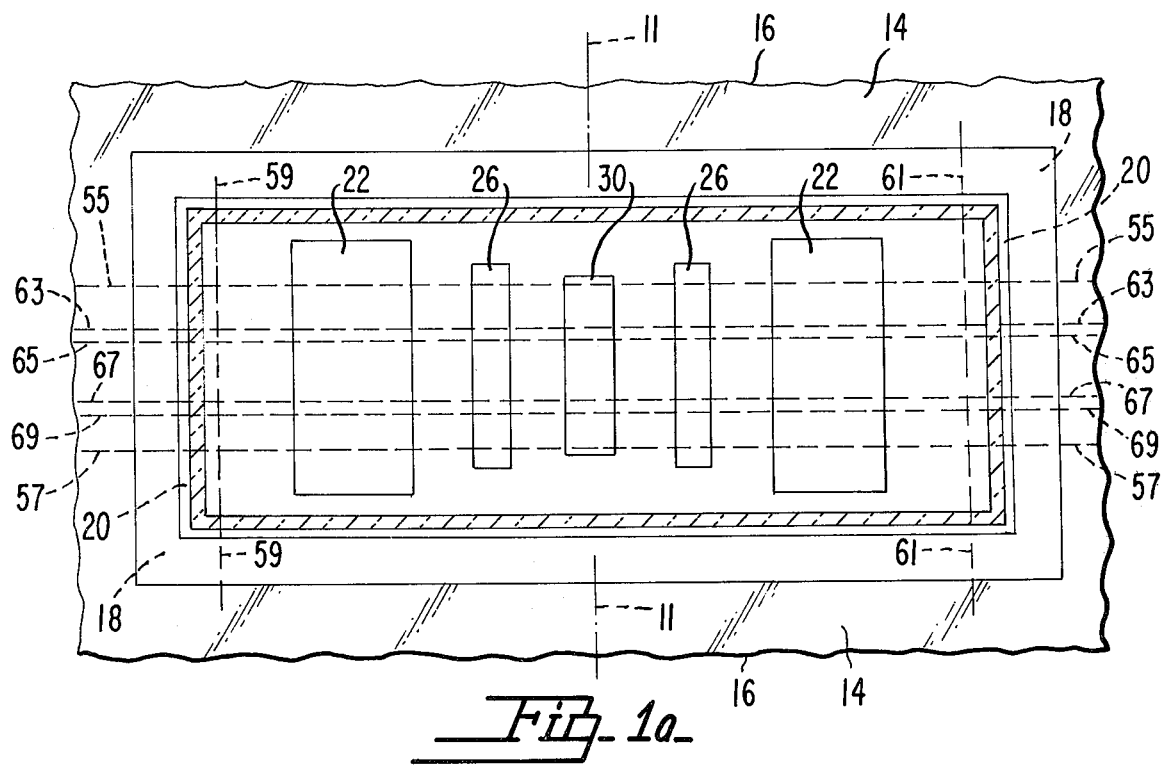
FIG. 1a is a fragmentary plan view of the transistor shown in FIG. 1, without metallization.
Figure 7:
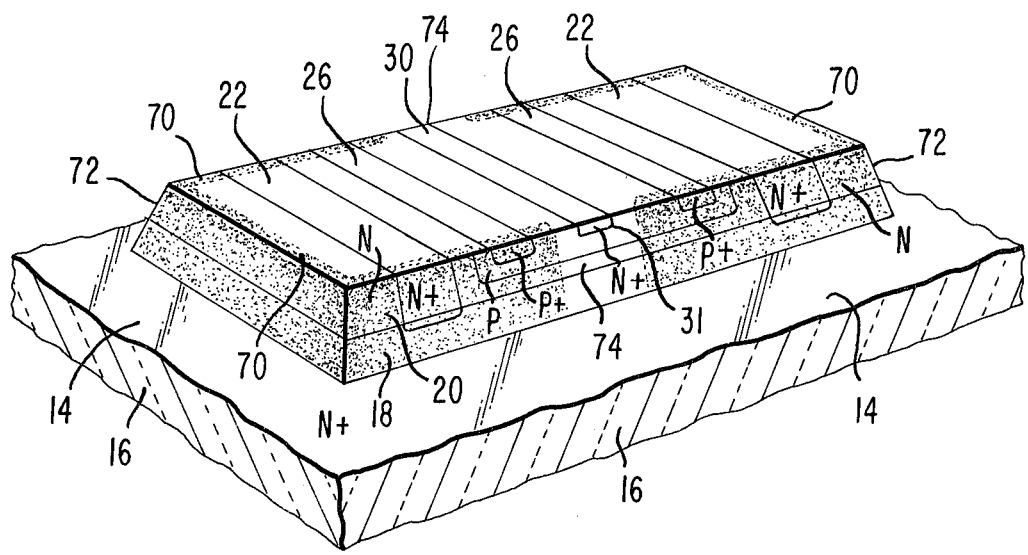

FIGS. 2, 3, 4, 5, and 6 are fragmentary cross-sectional views of the novel bipolar transistor, shown in FIGS. 1 and 1a, during progressive steps in the novel method of making it;

FIG. 7 is a perspective view of another embodiment of the novel transistor; and

Figure 8:
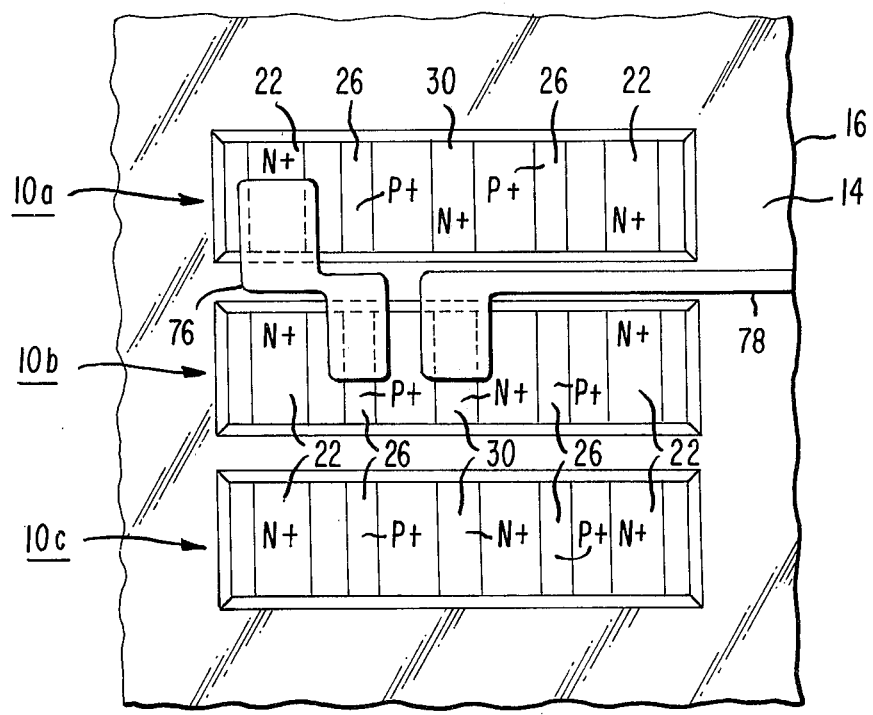

FIG. 8 is a plan view of a plurality of transistors of the type shown in FIGS. 1 and 1a, illustrating how a single transistor can be divided into a plurality of transistors, and showing low capacitance connections thereto.

Referring now to FIGS. 1 and 1a of the drawings, there is shown a preferred embodiment of the novel planar bipolar transistor 10, illustrated in mirror-image symmetry (about an imaginary plane 11 dividing the transistor 10 in half). The transistor 10 is formed in a layer 12 of the silicon that has been epitaxially deposited on a planar surface 14 of an insulating substrate 16, such as sapphire or spinel.

The silicon layer 12 consists of two strata, of substantially equal thickness; a lower stratum 18, adjacent to the substrate 16, and an upper stratum 20 disposed on the lower stratum 18.

The silicon layer 12 is of N type conductivity and has been epitaxially grown on the cleaned surface 14 of the electrically insulating substrate 16. The lower stratum 18 is doped with an N type conductivity impurity, such as phosphorus, for example, in a peak concentration of between about $5\times10^{18}$ and $5\times10^{22}$cm$^{-3}$, and the upper stratum 20 is also doped with an N type conductivity impurity in a peak concentration of between about $10^{16}$ and $10^{18}$cm$^{-3}$. The higher doping values of the above cited combinations are used when the series resistance is the major design factor to be minimized, whereas the lower doping values are used when a high voltage breakdown is desired.

The lower and upper strata 18 and 20 can be deposited epitaxially onto the substrate 16 in a continuous process by varying the concentration of the N type conductivity impurity during the epitaxial deposition, in a manner well known in the art.

A pair of collector contact wells 22 comprising ion-implanted phosphorus and arsenic atoms extends downwardly from the upper surface 24 of the silicon layer 12 into the lower stratum 18 and comprises the collector region with the N type silicon layer 12. A pair of base contact wells 26 of P type (boron) conductivity impurities is ion implanted into the upper stratum 20 of the silicon layer 12, and a base region 28, also of P type (boron) conductivity impurities is implanted into the upper stratum 20 in contact with the base contact wells 26. The base region 28 forms a PN junction 29 with the N type silicon layer 12 (the collector region).

An emitter region 30 of N type conductivity impurities, such as arsenic atoms, for example, is ion implanted into the center of the base region 28, forming a PN junction 31 therewith.

The collector contact wells 22, the base contact wells 26, and the emitter region 30 are separated from each other on the surface 24 of the silicon layer 12 by two or more of a plurality of superimposed silicon dioxide layers 42, 44, 46 and 48, formed during the manufacture of the transistor 10, as shown in FIG. 1 and as to be hereinafter explained. Although two collector contact wells 22 and two base contact wells 26 are described and shown, it is within the contemplation of the present invention to have, or use, either a plurality or only one collector contact well 22 and one base contact well 26, if so desired.

Before metallization of the collector, base, and emitter contacts, the transistor 10 is isolated as a mesa, as shown in FIGS. 1 and 1a, by etching the silicon dioxide layers 42, 44 and 46 by photolithographic means, whereby to reduce unwanted capacitance in the transistor 10 and to eliminate parasitic connections between the transistor 10 and possible neighboring components (not shown) also built on the insulating substrate 16.

Emitter, base and collector contacts 32, 34 and 36 are electrically connected to the emitter region 30, the base contact wells 26, and the collector contact wells 22, respectively. The contacts 32, 34 and 36 can be a single layer of aluminum, or a two layer structure wherein the lower layer is a chromium layer 28 in contact with the surface 24 of the silicon layer 12, and an upper gold layer 40 deposited over the chromium layer 38.

Figure 2:
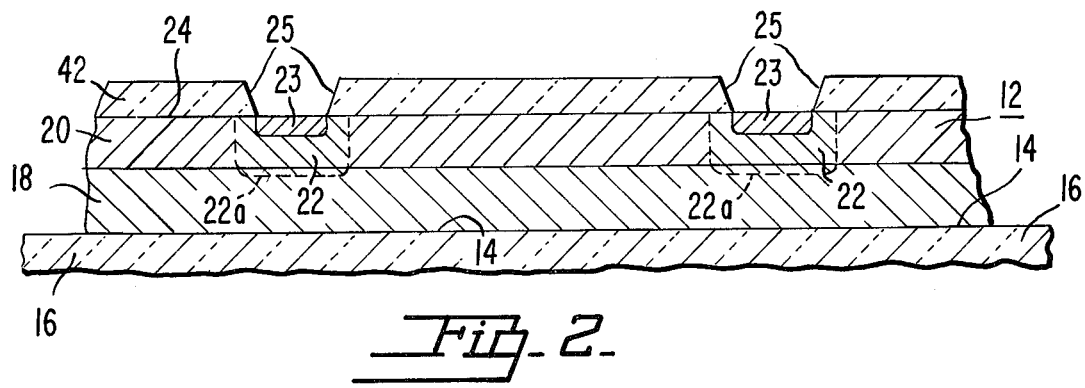

Referring now to FIG. 2 of the drawing, the transistor 10 is shown in an early stage of fabrication. The oxidation of silicon to silicon dioxide and the photoresist operations are conventional, well known in the semiconductor fabrication art, and therefore, will not be discussed in detail. The silicon layer 12 is grown epitaxially on the insulating substrate 16, of sapphire or spinel, by the pyrolysis of silane (SiH$_4$) in a vapor deposition process well known in the art. During the deposition of the silicon layer 12 onto the surface 14, a suitable N type dopant, such as phosphorous, for example, is introduced into the vapor deposition system in a quantity to provide the lower stratum 18 with an N type peak carrier concentration of between about $5\times10^{18}$ and about $5\times10^{20}$cm$^{-3}$. When about half of the desired thickness of the silicon layer 12 is deposited, the N type dopant in the vapor deposition system is reduced so that the upper stratum 20 has a peak carrier concentration of between about $10^{16}$ and about $10^{18}$cm$^{-3}$. The insulating substrate 16 has a thickness of about 0.25 mm and the silicon layer 12 has a thickness of between about 1 and about 5 $\mu$m (divided into the two strata 18 and 20).

The collector contact wells 22 (outlined by the dashed line 22a in FIG. 2) are provided to help reduce the series resistance of the bipolar transistor 10. To this end, the silicon dioxide layer 42 is formed on the upper surface 24 of the silicon dioxide layer 12, by any suitable conventional means known in the art. The silicon dioxide layer 42 has a thickness of about 0.4 $\mu$m. A pair of elongated substantially parallel openings 25 are formed in the silicon dioxide layer 42, by photolithographic technique known in the art, for ion implanting initial collector contacts 23. A dose of phosphorus of between about $5\times10^{14}$ and about $5\times10^{15}$cm$^{-2}$ at a voltage of between about 30 and about 300 KeV is ion implanted into the silicon layer 12 through the elongated openings 25. A phosphorus dose of about $1.23\times10^{15}$cm$^{-2}$ at a voltage of about 15 KeV is typical to form the collector contacts 23.

The structure of FIG. 2 is now annealed for about 15 minutes at between about 900°C and about 1100°C in a non-oxidizing ambient, such as helium, for example, to extend the collector contact wells 22 into the lower stratum 18 of the silicon layer 12, as outlined by the dashed lines 22a that represents the periphery of the collector contact wells 22. A typical annealing operation for this purpose is about 15 minutes at about 1050°C in helium. The collector contact wells 22 are now in good electrical contact with the stratum 18 of the silicon layer 12 that has the greatest number of conductivity modifiers, and hence a lower electrical resistivity than the upper stratum 20. The collector contact wells 22 and the silicon layer 12 comprises the collector region of the planar bipolar transistor 19.

Figure 3:
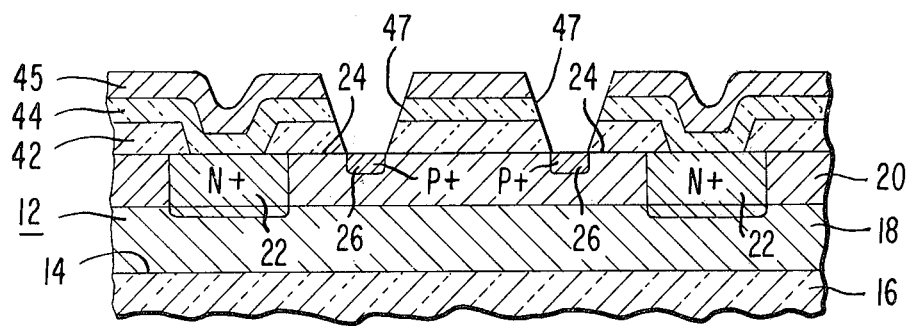

Referring now to FIG. 3, the bipolar transistor 10 is shown in the stage for the ion implantation of the base contact wells 26. The silicon dioxide layer 42 on the upper surface 24 of the silicon layer 12 is covered with the silicon dioxide layer 44, grown by any conventional means known in the art. The silicon dioxide layer 44 is covered with the photoresist 45, having a thickness of about 1.0 $\mu$m and, by photolithographic means known in the art, the silicon dioxide layers 44 and 42 are etched to provide a pair of elongated substantially parallel openings 47 to the upper surface 24 of the silicon layer 12. The base contact wells 26 are now ion implanted through the elongated openings 47 by an implant of boron of between about $5\times10^{14}$ and about $5\times10^{15}$ cm$^{-2}$ at between about 30 and about 300 KeV. A typical implant of boron for the base contact well 26 is about $2.83\times10^{15}$ cm$^{-2}$ at about 150 KeV.

The ion implantation of the base contact wells 26 is done while the surface 24 of the silicon layer 12 is covered with both the thin silicon dioxide layers 42 and 44 and the thin photoresist 45, except for the openings 47, to provide good masking. The silicon dioxide layers 42 and 44 would ordinarily be too thin for a mask without the photoresist 45.

Figure 4:
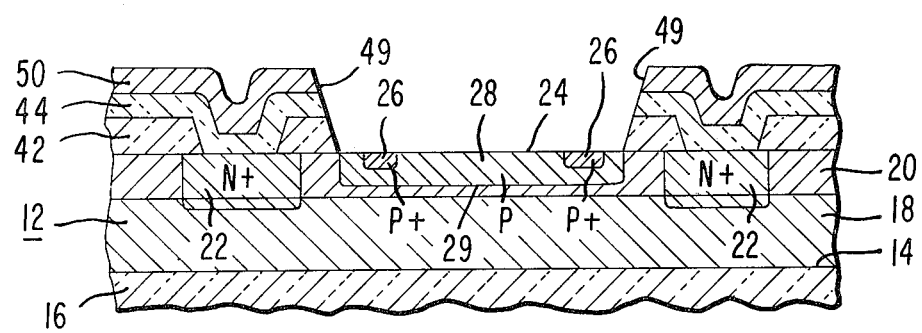

After the base contact wells 26 ion implantation, the photoresist 45 is removed and another photoresist 50 (FIG. 4) is deposited over the silicon dioxide layer 44 in preparation for forming the base region 28 of the bipolar transistor 10. The photoresist 50 is exposed and etched along with the silicon dioxide layers 44 and 42, by well known photolithographic means, to form a rectangular opening 49, as shown in FIG. 4. The base region 28 of the bipolar transistor 10 is formed by a double ion implantation of a P type conductivity impurity, such as boron atoms, for example. Preferably, a dose of about $3\times10^{12}$ cm$^{-2}$ at about 200 KeV is first ion implanted through the opening 49, and then a second dose of about $3\times10^{12}$ cm$^{-2}$ at about 30 KeV follows the first ion implanted dose. These doses of boron for the base region 29 can vary between about $5\times10^{11}$ and about $5\times10^{13}$ cm$^{-3}$ at a voltage of between about 30 and about 300 KeV, depending upon the characteristics desired in the finished bipolar transistor 10. The first deep ion implantation of boron controls the $\beta$, or current gain, of the bipolar transistor 10, and the lower energy dose helps to reduce the base lead resistance of the transistor 10. The double dose ion implantation for the base region 28 is carried out using both of the silicon dioxide layers 42 and 44 as well as the photoresist layer 50 as a mask because the thicknesses of the silicon dioxide layers 42 and 44 and and the photoresist 47 are in the neighborhood of 0.4 $\mu$m, 0.3 $\mu$m and 1.0 $\mu$m, respectively. The combined thickness of the silicon dioxide layers 42 and 44 and the photoresist 47, therefore, constitute a suitable mask for the ion implantation process.

Means are provided to implant the emitter region 30 (FIG. 5) through the upper surface 24 of the silicon layer 12. To this end, the photoresist 50 (FIG. 4) is removed and, the silicon dioxide layer 46 is deposited over the silicon dioxide layer 44 and the upper surface 24 of the silicon layer 12. By photolightographic technique, as by the application of a suitable photoresist, exposure, and etching in a manner well known in the semiconductor art, an elongated opening 51 (FIG. 5) is formed in the silicon dioxide layer 46 through which the emitter region 30 can be ion implanted. In addition to providing the opening 51 in the silicon dioxide layer 46, a pair of substantially parallel openings 53 (FIG. 5) are also etched through the silicon dioxide layers 42 and 44 and 46, by well known photolithographic techniques, so that the contact wells 22 can be ion implanted additionally with the same atoms used to ion implant the emitter region 30, as indicated by the dashed outline 52 (FIG. 6). This technique provides the contact wells 22 with very good electrically conductive means to the metal contact 36 to be added subsequently.

The emitter region 30 is formed by ion implanting an N type conductivity impurity, such as arsenic atoms, for example, in a dose of between about $5\times10^{14}$ and about $5\times10^{15}$ cm$^{-2}$ at between about 30 and about 300 KeV. A typical ion implantation of arsenic atoms in the emitter region 30 is a dose of about $7.77\times10^{14}$ cm$^{-2}$ at about 40 KeV.

Figure 5:
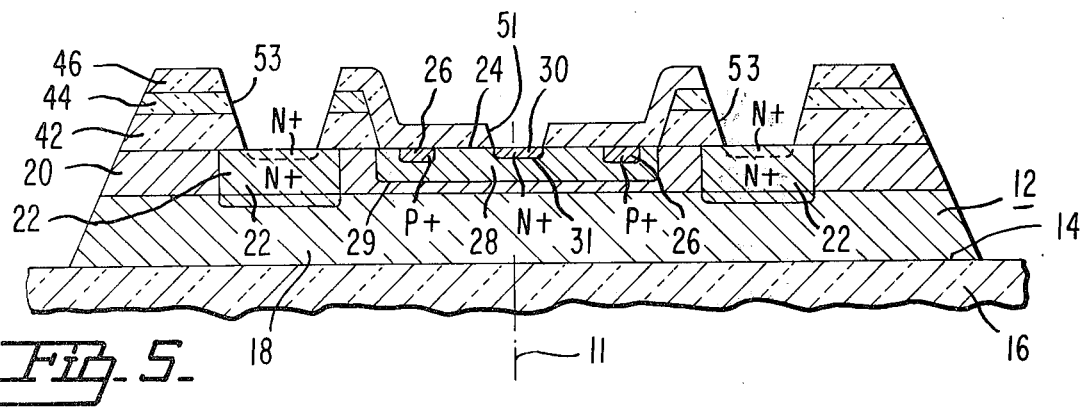
Figure 6:
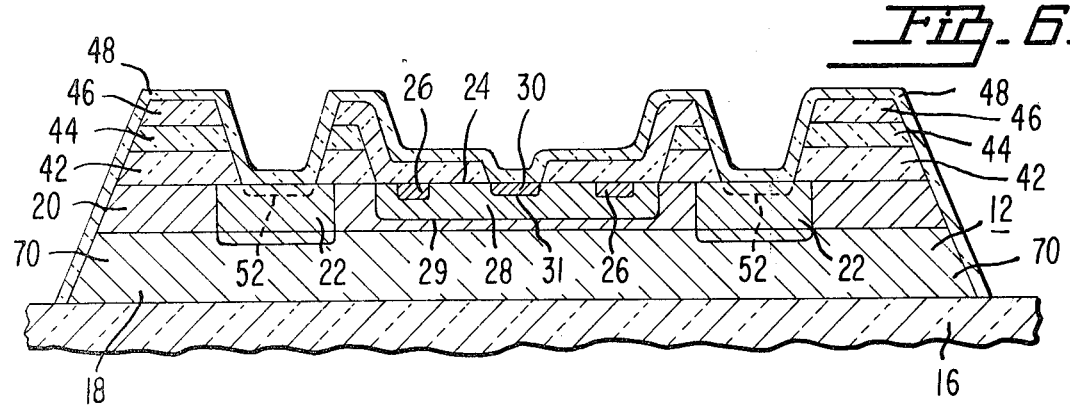

At this point, one can isolate the bipolar transistor 10, shown in FIGS. 5 and 1, into one or more mesas (islands) on the surface 14 of the substrate 16, as shown in FIGS. 7 and 8. The formation of one or more mesas to provide one or more bipolar transistors 10 is accomplished by photolithographic means, as by applying a silicon dioxide layer over the transistor 10 thus far completed and defining the desired means with a photoresist pattern on the applied silicon dioxide layer. Thus, for example, if a single bipolar transistor 10 on a mesa structure is desired, the structure of FIG. 1a is etched to the surface 14, by photolithographic means, to leave the structure between the dashed lines 55 and 57 and between the dashed lines 59 and 61, as shown in FIG. 7. If more than one bipolar transistor 10 is desired, the structure shown in FIG. 1a is etched to the surface 14 to leave the structures between the dashed lines 59 and 61, and between the dashed lines 55 and 63, 65 and 67, and 69 and 57, providing three transistors 10a, 10b and 10c as mesas on the insulating substrate 16, as shown in FIG. 8. Thus, the present novel method provides a structure where one or more planar bipolar transistors have a high density packing capability with low capacitance and feedback characteristics.

In another embodiment of the present invention, the transistor thus far fabricated is provided with means to stabilize with respect to leakage currents. To this end, an edge-guard region 70 is implanted through the periphery 72 of the mesa, as shown in FIG. 7, except for the region 74 where the emitter region 30 and the PN junction 31 are exposed. This is accomplished by first applying a photoresist over the bare exposed periphery 72 (FIG. 7), to protect the emitter-base junction 31 from the edge-guard ion implantation. The periphery 72 (except for the region 74) is then exposed by photolithographic means, and ion implanted with a dopant species of the opposite type conductivity from that of the base dopant. The level of ion implantation here is about two to five times the level of the original base dopant ion implant. Hence, in the present example, the dose of atoms implanted into the edge-guard region 70 is between about $10^{12}$ and about $10^{14}$ atoms/cm$^2$ with energies of between about 30 and about 300 KeV. Each of the transistors 10a, 10b, and 10c shown in FIG. 8, could also have edge-guard regions 70 implanted in the peripheries of their mesas, if so desired.

An anneal of about 10 minutes at between about 700°C and 900°C in a non-oxidizing ambient is used to activate the atoms implanted into the emitter region 30, the base region 28, and the edge-guard region 70. The temperature of the anneal is very important. The temperature should be just high enough to activate the arsenic atoms but as low as possible to reduce the possibility of punch-through shorts. Actually, annealing proceeds at a lower temperature in silicon on sapphire than in bulk silicon material, and advantage is taken of this fact in the manufacture of the bipolar transistor 10.

Before any annealing of the emitter region 30 and/or the edge-guard region 70 can take place, however, it has been found necessary to cap the emitter region 30 and the edge-guard region so that the ion implanted arsenic atoms are not out diffused and evaporated. To this end, the emitter region 30 is capped with the silicon dioxide layer 48 of about 0.1 micron in thickness, as shown in FIG. 6. The layer 48 may preferably be of silicon nitride because then it can be removed so that contact to the emitter can be made without affecting the silicon dioxide layers 42, 44 and 46, since silicon nitride dissolves in solvents which do not affect silicon dioxide. The capped structure, shown in FIG. 6 can now be annealed without a serious loss of the implanted ions in the emitter region 30 and the edge-guard region 70. The silicon dioxide layer 48 also caps the collector contact wells 22 so that no loss of the arsenic atoms (from the portion of the wells 22 included within the dashed line 52) injected during the formation of the emitter region 30 can escape from the collector contact wells 22 during the annealing operation.

The collector contact well 22, the base contact wells 26, and the emitter region 30 are now exposed, by suitable well-known photoresist and etching techniques, so that the metal contacts 36, 34 and 32 can be made for the collector, base, and emitter, respectively, of the transistor 10. The metal contacts 32, 34 and 36 are made preferably by the successive evaporation of the chromium layer 28 and the gold layer 40, followed by a photoresistive delineation to remove the unwanted metal. The chromium layer 38 can have a thickness of between about 100A and about 500A, and the gold layer 30 can have a thickness of between about 5,000A and about 25,000A. The contacts 32, 34 and 36 may also be of aluminum instead of the double layers 38 and 40 of chromium and gold. The finally constructed transistor 10 is annealed at between about 300°C and 350°C in hydrogen for about 15 minutes.

Metal interconnections between, and to transistors, on different mesas can be made at the same time, and in the same manner, as the metal contacts are made to the transistors. Thus, for example, a metal connection 76 is shown, in FIG. 8, between the base contact well 26 of the transistor 10b and the collector contact well 22 of the transistor 10a. It is noted that the connection 76 extends to the surface 14 of the insulating substrate 16. This structure reduces unwanted capacitance and feedback. Similarly, a metal connection 78 is deposited mainly on the surface 14 of the substrate 16 and is connected to the emitter region 30 of the transistor 10b.

While the transistor 10 has been described and illustrated in mirror image symmetry, it is within the contemplation of the present invention to encompass other physical arrangements of the emitter, base, and collector well known in the art. Also, although the novel transistor and method of making it have been described and illustrated with NPN transistors, it is within the contemplation of the present invention to include NPN transistors as well.

What is claimed is:

1. A bipolar transistor comprising:
   an electrically insulating substrate,
   a mesa comprising a layer of single-crystal semiconductor material of one type conductivity on a surface of said substrate, said layer having a planar surface and a thickness of between about 0.5 $\mu$m and about 5 $\mu$m,
   a base region of an opposite type conductivity disposed in a portion of said layer, said layer comprising a collector region,
   an emitter region of said one type conductivity disposed in a portion of said base region and defining with said base region an emitter-base junction,
   each of said regions having a planar surface coplanar with said planar surface of said layer, said mesa having a periphery in which a portion of said emitter-base junction terminates, and
   an edge-guard region of said one type conductivity disposed in said periphery of said mesa, except in said emitter region and said emitter-base junction.

2. A bipolar transistor as described in claim 1, wherein:
   said substrate is an electrical insulator selected from the group consisting of sapphire and spinel, and
   said layer comprises silicon.

3. A bipolar transistor as described in claim 1, wherein:
   an elongated collector contact well is disposed in said layer,
   an elongated base contact well is disposed in said base region,
   said emitter region and is elongated and parallel to both said collector contact well and said base contact well, whereby said transistor can be etched in portions transversely disposed to said emitter region so as to divide said transistor into a plurality of mesas, each mesa comprising a bipolar transistor.

* * * * *